United States Patent [19]
Kuczynski et al.

[11] Patent Number: 6,008,266
[45] Date of Patent: *Dec. 28, 1999

[54] PHOTOSENSITIVE REWORKABLE ENCAPSULANT

[75] Inventors: Joseph Paul Kuczynski, Rochester; Laura Marie Mulholland, Zumbro Falls, both of Minn.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/696,398

[22] Filed: Aug. 14, 1996

[51] Int. Cl.$^6$ .......................................................... C08F 2/46
[52] U.S. Cl. ............................ 522/31; 522/100; 522/103; 522/170
[58] Field of Search ............................... 522/31, 100, 103, 522/170

[56] References Cited

U.S. PATENT DOCUMENTS

| | | | |
|---|---|---|---|
| 2,895,962 | 7/1959 | Fischer ................................. | 260/340.7 |
| 4,216,288 | 8/1980 | Crivello ................................. | 430/280 |
| 4,245,029 | 1/1981 | Crivello ................................. | 430/280 |
| 4,256,828 | 3/1981 | Smith ..................................... | 430/280 |
| 4,289,595 | 9/1981 | Tortorello ............................. | 204/159.11 |
| 4,442,197 | 4/1984 | Crivello et al. ...................... | 430/280 |
| 4,987,158 | 1/1991 | Eckberg ................................. | 522/31 |
| 5,102,772 | 4/1992 | Angelo et al. ........................ | 430/280 |
| 5,155,143 | 10/1992 | Koleske ................................. | 522/31 |
| 5,229,251 | 7/1993 | Babich et al ......................... | 430/280 |
| 5,366,846 | 11/1994 | Knudsen et al. ....................... | 430/280 |
| 5,373,032 | 12/1994 | Miller et al. .......................... | 522/31 |
| 5,439,766 | 8/1995 | Day et al. ............................... | 430/18 |
| 5,439,779 | 8/1995 | Day et al. ............................... | 430/280 |
| 5,512,613 | 4/1996 | Afzali-Ardakani et al. ............ | 523/443 |
| 5,560,934 | 10/1996 | Afzali-Ardakani et al. ............ | 424/497 |
| 5,599,651 | 2/1997 | Steinmann et al. ................... | 430/280.1 |

FOREIGN PATENT DOCUMENTS

| | | | |
|---|---|---|---|
| 2004517 | 6/1991 | Canada ................................. | 552/170 |
| 532896 A2 | 3/1993 | European Pat. Off. ........ | C08G 59/22 |

OTHER PUBLICATIONS

Stephen L Buchwalter and Laura L Kosbar, "Cleavable Epoxy Resins: Design for Disassembly of a Thermoset", Journal of Polymer Science Part A: Polymer Chemistry, vol. 34, pp. 249–260, Jan. 18, 1996.

*Primary Examiner*—Nam Nguyen
*Assistant Examiner*—Steven H. Ver Steeg
*Attorney, Agent, or Firm*—John J. Gresens; Matthew J. Bussan

[57] ABSTRACT

An uncured thermosetting composition which is capable of curing upon exposure to actinic radiation is disclosed. The composition includes an acetal diepoxide of the formula:

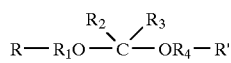

wherein R and R' are individually an aliphatic epoxy, or a cycloaliphatic epoxy; $R_1$ and $R_4$ are individually an alkyl, substituted alkyl, aryl, aryl alkyl; and $R_2$ and $R_3$ are individually hydrogen, alkyl, alkoxy, substituted alkyl aryl, alkyl aryl, and cyclic alkyl; as well as a photoinitiator, and an inorganic filler. The composition of the invention may also include a second epoxy functional resin, a flexibilizer, and other adjuvants. Other aspects of the invention include the cured resin encapsulant and a method of recovering the resin from a circuit assembly.

38 Claims, 2 Drawing Sheets

PHOTOSENSITIVE REWORKABLE ENCAPSULANT

FIELD OF THE INVENTION

The invention relates generally to epoxy-based reworkable encapsulants for integrated circuit assemblies. More specifically, the invention relates to photosensitive reworkable encapsulants for integrated circuits which comprise acetal diepoxides and which are curable with actinic radiation.

BACKGROUND OF THE INVENTION

Thermoset compositions such as epoxy resins are important in the manufacture and processing of circuit assemblies. The diverse number of applications include coatings, adhesives, structural materials, electrical insulation, as well as encapsulation and sealing. The attributes of epoxies include the combination of processability prior to curing with outstanding properties after curing. Epoxies generally have a low viscosity prior to curing, even in the absence of solvents. After curing, epoxies exhibit toughness, adhesion, and solvent resistance.

The attribute of epoxies also include intractability after curing. This intractability is the result of a curing reaction to convert a low molecular weight precursor to a polymer network of essentially infinite molecular weight. These attributes make epoxies ideal for use in the construction of circuit assemblies such as single-sided and double-sided circuits, as well as other types of surface mount technology including chip carriers, multichip modules and multilayer boards.

Examples of various polymer systems which are radiation curable include Day, U.S. Pat. Nos. 5,439,779 and 5,439,766, Smith, U.S. Pat. No. 4,256,828, Tortorello, U.S. Pat. No. 4,289,595, Knudsen, U.S. Pat. No. 5,366,846, Koleske, U.S. Pat. No. 5,155,143, and Eckberg, U.S. Pat. No. 4,987,158, which all describe UV curable compositions that incorporate onium salts, epoxy monomers, epoxy novolaks, silicone epoxides, and polybutadiene epoxides, in addition to resin modifiers such as hydroxy compounds, and inorganic fillers. Miller et al., U.S. Pat. No. 5,373,032 discloses radiation curable urethanyl prepolymers which polymerize in the presence of a cationic curing agent. Babich et al., U.S. Pat. No. 5,229,251 discloses an epoxide photoresist which is curable in ambient conditions when combined with an organo-silicon and an onium salt.

Fisher, U.S. Pat. No. 2,895,962 discloses acetal epoxides synthesized from the reaction of polyhydric alcohols and ethylenically unsaturated aldehydes.

However, these compositions, once cured, form non-reworkable and intractable masses. The intractability of thermosets has become more of a liability because of concerns about the longitivity of circuit assemblies in the environments of use. Also, many manufacturers are taking responsibility for disposal or recycling of their products. Manufacturers may even be required to be responsible for disposal or recycling of products through government regulation.

Intractable thermosets are also not compatible with the concept of disassembly for purposes of disposal, repair, or recycling, whether the thermosets are used as structural components, adhesives, or encapsulants. If, however, the thermoset itself is designed for disassembly on the molecular scale, it is possible that the many advantages of the thermosets can be retained without the disadvantages of intractability. As demand increases for recyclable products, diepoxide materials which allow for reworkability may well offer a means of maintaining the utility of thermoset materials which offer repair, replacement, recovery, or recycling.

As a result, there is a need for photosensitive encapsulants which provide the requisite curing properties and physical stability once cured which are at the same time reworkable so as to allow for the recovery of various thermosetting systems.

SUMMARY OF THE INVENTION

One aspect of the invention is an uncured thermosetting composition which is capable of curing upon exposure to actinic radiation. The composition includes an acetal diepoxide of the formula:

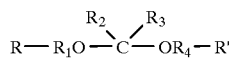

wherein R and R' are individually an aliphatic epoxy moiety, or a cycloaliphatic epoxy moiety; $R_1$ and $R_4$ are individually an alkyl, substituted alkyl, aryl, or aryl alkyl; and $R_2$ and $R_3$ are individually hydrogen, alkyl, alkoxy, substituted alkyl aryl, alkyl aryl, and cyclic alkyl. The composition also includes a photoinitiator, and an inorganic filler. Optionally, the composition may additionally include a flexibilizer. Further, in order to control temperature, humidity, and moisture sensitivity, the composition of the invention may comprise a second epoxy functional resin.

In accordance with a further aspect of the invention, there is provided a cured encapsulant resin which is the reaction product of the disclosed acetal diepoxide composition.

In accordance with an additional aspect of the invention there is provided a method of recovering a cured thermosetting encapsulant resin comprising the reaction product of an acetal diepoxide, a photoinitiator; and an inorganic filler. The cured encapsulant resin is soluble in a dilute acid solution thereby allowing recovery. The method includes the steps of subjecting the encapsulant resin to an acidic solvent for a period of time adequate to substantially dissolve the resin.

Epoxy compositions are thermosetting materials which are extremely difficult, if not impossible, to remove following cure. To circumvent this problem, the epoxy monomer of the invention is curable using actinic radiation and incorporates a cleavable acetal linkage which renders the cured epoxy formulations soluble in a suitable solvent blend. Soluble epoxy encapsulants are advantageous for many applications, such as reinforcing solder joints and wire bonds in microelectronic devices. Removal of the epoxy permits replacement of defective chips on circuit assemblies without having to discard the assembly to which the chip is bonded.

In a more preferred mode, the claimed invention uses an acid generating photoinitiator to crosslink a cycloaliphatic epoxy. The cured epoxy is soluble in dilute acidic media and reworkable which is highly desirable and cost effective. The claimed epoxy formulations crosslink rather than hydrolyze in the presence of the photogenerated acid. This behavior is unexpected in linear acetals. The claimed curable acetal diepoxide formulations crosslink upon exposure to actinic radiation. Yet these compositions remain soluble in acidic media, thereby providing a composition which has the properties of a thermoset while remaining reworkable.

In application, the preferred sulfonium salt photoinitiators liberate strong, protic acids upon exposure to actinic radiation, yet the acetal diepoxide rapidly crosslinks to form a cured thermoset material. Since formulations containing the acetal diepoxide are readily dissolved in solutions containing, for example, only as much as 0.3M methane sulfonic acid, it is unexpected that formulations containing the acetal diepoxide can be cured with superacids such as those liberated upon photolysis of onium salt photoinitiators.

Further, by blending the acetal with a conventional cycloaliphatic epoxide, the temperature and humidity stability of the formulation is enhanced. Formulations consisting of a 50:50 weight blend of the acetal diepoxide and a second epoxide resin of for example cycloaliphatic epoxy or bisphenol A or F are soluble in a solvent mixture comprised of 0.3M methane sulfonic acid in a 1:1:1 blend of n-butyl alcohol, ethylene glycol and xylene.

DETAILED DESCRIPTION OF THE INVENTION

Figure 1A:
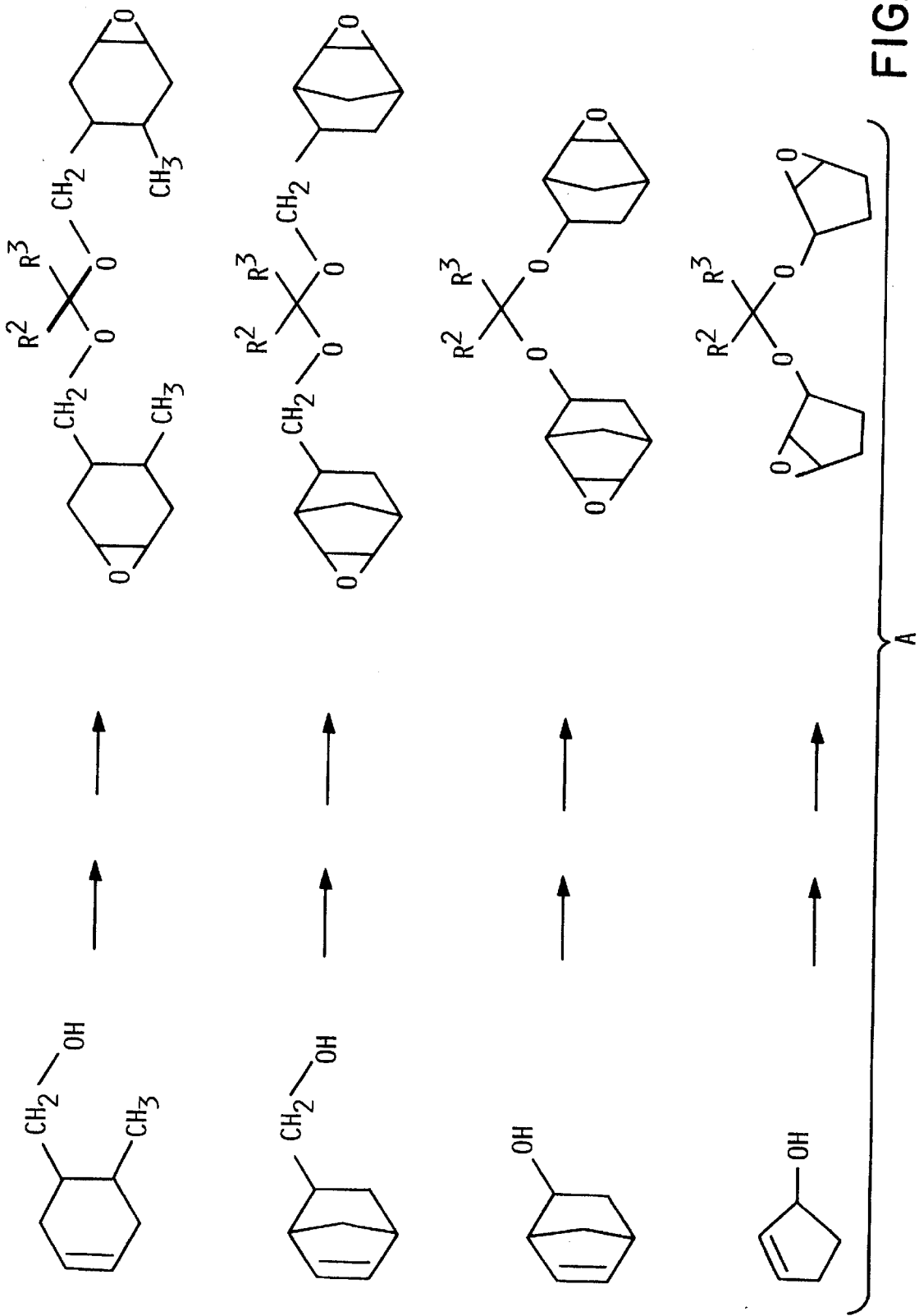
FIG. 1 is a schematic depiction of various reaction mechanisms useful in forming some of the epoxies used in the encapsulant composition of the invention.

The invention is an uncured thermosetting resin, cured encapsulant, and method of recovering cured encapsultant compositions.

THE ENCAPSULANT

The composition of the invention comprises a family of epoxy compositions which may be cured with actinic radiation and then are removable in certain acidic solvents because of the cleavable acetal link connecting the epoxy groups. The composition of the invention provides a recoverable encapsulant with a glass transition temperature (Tg) which allows use of the system in circuit assemblies.

The uncured thermosetting composition which is capable of curing upon exposure to actinic radiation, comprises an acetal diepoxide. The composition of the invention also includes a photoinitiator, and an inorganic filler. Optionally, the invention may also include a flexibilizer and a second epoxy functional resin.

A. THE ACETAL DIEPOXIDE

The invention is based on the recognition that certain epoxy resins may be cured with actinic radiation by using onium and preferably sulfonium photoinitiators and then solubilized when subjected to an acid-based solvent for reworking.

The appropriate epoxide preferably has: (1) a chemical structure which is stable under conditions in which the cured matrix would normally be exposed; (2) a chemical structure which is sufficiently stable as a thermoset in the intended application; (3) a chemical structure which allows dissolution and reworkability under specific conditions; (4) a chemical structure which reacts as intended during the curing of the epoxy to form a polymeric matrix; and (5) a practical synthesis making the epoxide readily available.

Generally, the acetal diepoxide of the invention has the formula:

(I)

In the structure of the diepoxide of the invention, R and R' may be an aliphatic epoxy moiety or a cycloaliphatic epoxy moiety as well as a substituted cylclohexane moiety. Various exemplary moieties which may be R and R' can be seen in FIG. 1, including cyclic alkyl, bridged or fused alkyl, heterocyclic alkyl, and polycyclic alkyl epoxy moieties as well as mixtures thereof within R and R' and within the various monomers used. Aliphatic epoxy moieties may include alkyl, alkoxy, substituted alkyl, alkyl aryl and mixtures thereof, between R and R' as well as within the monomers used in the composition.

The ketal and acetal groups have been identified as candidates meeting the above criteria. For the purposes of this invention, the term "acetal" refers to the 1,1-dialkoxy group as depicted in Formula 1, above, where $R_2$ and $R_3$ can be alkyl, aryl, aryl alkyl alkoxy, substituted alkyl aryl, cyclic alkyl, or hydrogen. The general use of the term "acetal" includes ketals where $R_2$ and $R_3$ are equivalent to alkyl, aryl, or aryl alkyl; acetals where $R_2$ is equivalent to alkyl, aryl or aryl alkyl and where $R_3$ is H and formulas where $R_2$ and $R_3$ are H.

As disclosed in March, *J. Advanced Organic Chemistry* (3d ed.), Wiley Interscience 329–331 (1985), the known organic chemistry of ketals and acetals indicates that they are exceedingly stable to hydrolysis in the absence of acids, but break down readily in acid, even weak acids. Ketals and acetals are not subject to reactions similar to those of epoxy groups, and thus an acetal or a ketal link should not be affected by the curing reaction of the epoxy matrix.

Acetals can be hydrolyzed in acidic aqueous solutions, but they are also susceptible to trans-etherification under acidic conditions. Because the network fragments are organic solvent-soluble and not water-soluble, it has been found that the best preferred solvents for dissolution of the cleavable networks are those containing an alcohol and some organic acid such as methanesulfonic acid or p-toluene sulfonic acid. It then becomes possible to use an alcohol as both the solvent and the reactant which eliminates the necessity of adding water.

Control of the degradability/stability of the compositions with respect to ambient moisture is achieved, pursuant to the invention, by using variables in the formulation. The structure of the cleavable link can be varied to adjust the stability of the link to hydrolysis. The rate of hydrolysis of acetals is affected by the substituents on the central carbon of the acetal. Considering for illustration purposes only methyl and hydrogen substituents, the formal, with two hydrogens on the central carbon is slowest to hydrolyze; the acetal, with one hydrogen and one methyl, hydrolyzes considerably more easily; and the ketal, with two methyls, hydrolyzes the fastest of the three. By choosing diepoxides linked by formal, acetal, and ketal groups or by choosing some mixture of these; the formulator can adjust the degradability of the resulting thermoset network to match the requirements of his application. For some applications, addition of non-cleavable diepoxides such as 3,4-epoxycyclohexylmethyl 3,4-epoxycyclohexanecarboxylate or bisphenol A diglycidyl ether, may be advantageous.

The ketal/acetal diepoxide structure is shown in Formula I, in which $R_2$ and $R_3$ can be any combination of hydrogen, methyl, ethyl, propyl, iso-propyl, butyl, iso-butyl, other alkyl, phenyl, benzyl, substituted phenyl or substituted benzyl. Substituents on the phenyl or benzyl can be at one or more of the available aromatic positions and can be a halogen such as chlorine, bromine, or fluorine, a nitro group, any alkyl group such as methyl, ethyl, or isopropyl, an alkoxy group such as methoxy, ethoxy, or isopropoxy, an acyl such as acetyl or benzoyl, or any of the family of aromatic substituent groups well known in organic chemistry. As can be seen by the structure of Formula I, the diepoxide can be any diepoxide in which the two epoxide groups are connected by an acetal or ketal. The preferred diepoxide structure is acetaldehyde bis-(3,4-epoxycyclohexylmethyl)acetal (more conveniently known as acetal diepoxide).

The epoxy structures suitable for use in this invention are those derived from olefinic alcohols. The alcohol functionality preferably is an aliphatic primary or secondary alcohol group, most preferably a primary alcohol group. The olefinic functionality is preferably an aliphatic double bond, most preferably a mono-substituted or a 1,3- and 1,4-disubstituted double bond, and must be suitable for epoxidation with an epoxidation reagent known in the art, such as peracetic acid, perbenzoic acid, metachloroperbenzoic acid, potassium peroxymonosulfate, and the like.

Figure 1B:
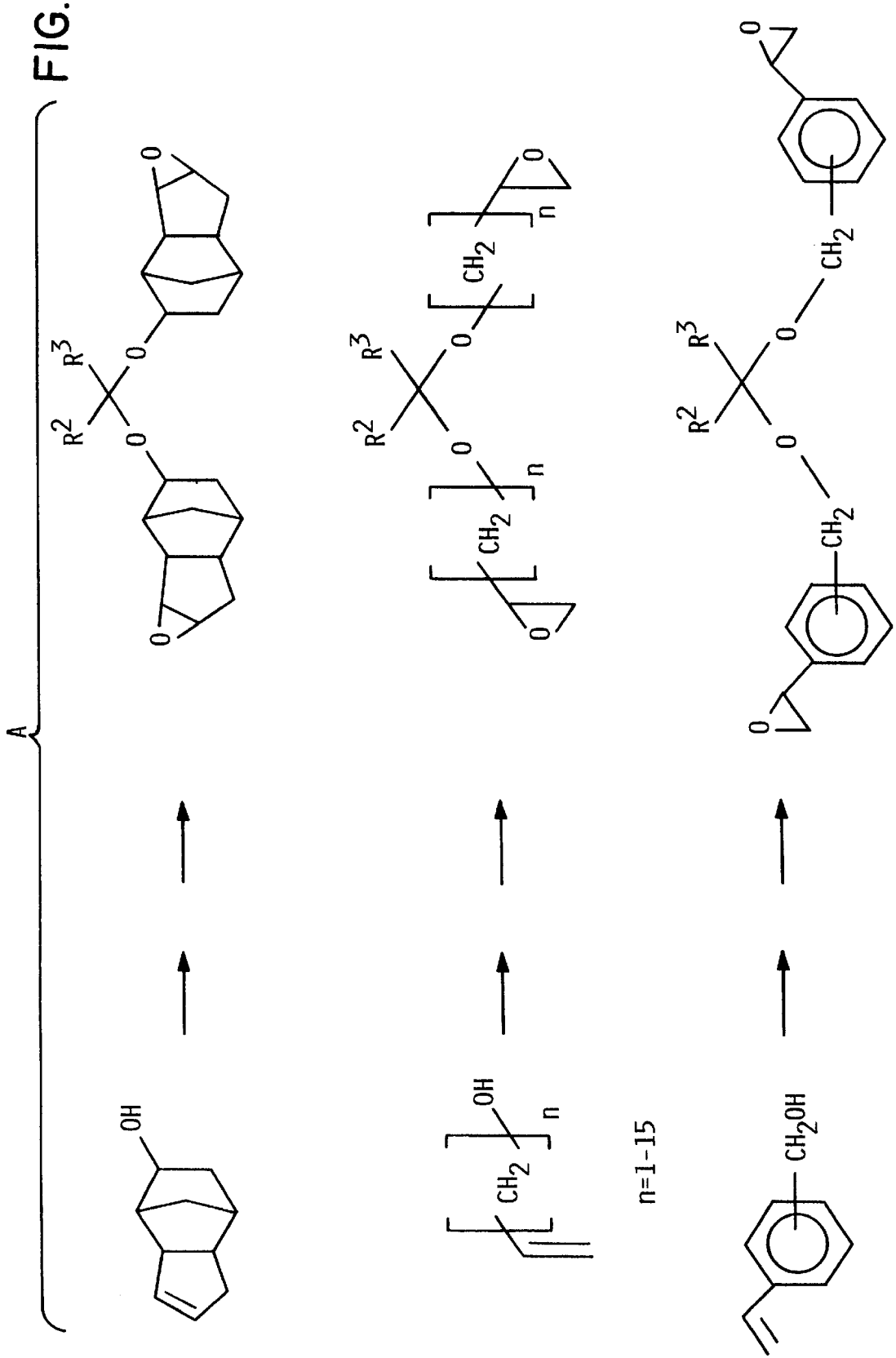

Alternative olefinic alcohols and the acetal or ketal diepoxides derived from them are shown in FIG. 1, in which $R_2$ and $R_3$ are as in Formula I. Similarly, $R_1$ and $R_4$ may be any alkyl, substituted alkyl, alkoxy, aryl or aryl alkyl as with $R_2$ and $R_3$. In one preferred mode R and R' are cyclohexane, $R_2$ and $R_3$ are hydrogen and methyl, respectively, and $R_1$ and $R_4$ are methyl.

Generally, the concentration of acetal diepoxide may range from about 5 wt % to 99 wt %, preferably 10 wt % to 50 wt %, and more preferably from 15 wt % to 25 wt % in the uncured encapsulant composition.

B. THE SECOND EPOXY FUNCTIONAL RESIN

The composition of the invention may also comprise a second epoxy functional resin. Generally, a second epoxy functional resin may be used to control resistance to temperature extremes, humidity, and ambient moisture. Further, the use of a second epoxy functional resin may also provide higher Tg.

Representative epoxy functional resins include diglycidyl ethers of bisphenol A, bisphenol F resins, (that is 2,2'-methylenebisphenol), and cycloaliphatic epoxy resins including diglycidyl esters of cyclic dicarboxylic acids and acid epoxidized cyclolefins.

Preferred resins include cycloaliphatic epoxy resins such as bis (3,4-epoxycyclohexylmethyl) adipate sold by Union Carbide as ERL 4299, and 3,4-epoxycyclohexylmethyl-3,4 epoxycyclohexylmethyl carboxylate also sold by Union Carbide as ERL 4221 as well as diglycidyl ethers of bisphenol A.

Generally, the concentration of this second epoxy functional resin may range from about 0 wt % to 50 wt %, preferably from about 5 wt % to 35 wt %, and more preferably from about 15 wt % to 25 wt % in the uncured system. Further, when present, the ratio of acetal diepoxide to second epoxy functional resin preferably ranges from about 1:1 to 3:1.

Within these constraints, the second epoxy functional resin may be added to the uncured thermosetting composition to affect resistance to temperature extremes, humidity, moisture, and provide a higher Tg. However, increasing the concentration of the second epoxy functional resin may also reduce the reworkability of the composition of the invention once cured.

C. THE PHOTOINITIATOR

The composition of the invention may also comprise a photoinitiator. The photoinitiator, when exposed to actinic radiation, generally initiates the generation of free radicals and cationic curing catalysts. This activity promotes the reduction and reconstruction of bonds towards the formation of the cured polymer network which becomes the encapsulant of the invention.

Any number of photoinitiators which react to generate an acid catalyst when subjected to actinic radiation may be used in accordance with the invention. Photoinitiators useful in the invention include ionic and nonionic photoacid generators which produce a protic acid when subjected to actinic radiation.

Nonionic photo initiators include photoacid generators such as nitrobenzyl esters, sulfones, phosphates, N-hydroxyimide sulfonates, sulfonic acid esters of phenol, diazonaphthoquinones, and imino sulfonates among others.

Preferably, ionic photoacid generators are used. One class of ionic photoacid generators include compounds susceptible to actinic radiation includes onium compounds such as aryl diazonium salts ($ArN_2^+X^-$), diaryliodonium salts ($Ar_2I^+MXn^-$), and triaryl sulfonium salts ($Ar_3S^+MXn^-$).

Preferably, the photoinitiator is a sulfonium salt. The sulfonium salts which may useful in accordance with the invention include those disclosed in Crivello, U.S. Pat. No. 4,245,029 issued Jan. 13, 1981, and Crivello et al., U.S. Pat. No. 4,442,197 issued Apr. 10, 1984, both of which are incorporated herein by reference.

Exemplary sulfonium compounds include arylacyldialkyl sulfonium salts of the Formula II,

(II)

while aromatic ketones such as thioxanthone, chlorothioxanthone and benzophenone have been found to be effective as sensitizers for hydroyaryldialkyl sulfonium salts of the Formula III,

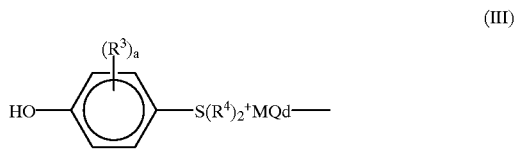

(III)

where in either Formula (II) or (III) R is a $C_{(6-13)}$ monovalent aromatic organic radicals or substituted $C_{(6-13)}$ monovalent aromatic organic radicals, $R^1$ is a monovalent radical selected from hydrogen, $C_{(1-8)}$ alkyl and mixtures thereof, $R^2$ is a $C_{(1-13)}$ monovalent organic radical, $R^3$ is a monovalent radical selected from $C_{(1-8)}$ alkyl, hydroxy, $C_{(1-8)}$ alkoxy, halo and nitro, $R^4$ is a $C_{(1-8)}$ alkyl radical, M is a metal or metalloid, Q is a halogen and d is equal to 4–6.

The concentration of this constituent in the invention may range from about 0.1 to 5 wt %, preferably from about 0.5 to 3 wt %, and most preferably about 1.0 to 2 wt % of the uncured system. Preferably, the photoinitiator is the triarylsulfonium salt from Union Carbide as UVI 6974H.

D. THE FLEXIBILIZER

The composition of the invention may also comprise a flexibilizer. Generally, the flexibilizer as is implied by its name, provides a lower Tg. Useful flexibilizers include rubber compounds and hydroxy functional compounds.

In theory, the flexibilizer acts as a chain transfer agent promoting the formation of a cured polymer network where there is a larger number of shorter polymeric chains instead of a smaller number of longer polymeric chains. One common chemical mechanism for promotion of the incorporation of the flexible character into the epoxy-based resin is the addition of hydroxy functional compounds which react directly with the epoxy. As the oxirane ring is terminated, the cation that is formed reacts with the hydroxyl group of the hydroxy functional compound. Not only does this provide for the direct incorporation of the flexibilizer within the polymeric chain, but it also provides for the termination or transfer of the chain.

Representative hydroxy functional compounds which may be useful in accordance with the invention include any polyetherdiol or polyesterdiol which can be used as a flexibilizer including polyethylene glycol, polypropylene glycol, poly(caprolactone)diol, or poly(oxybutylene)diol. The optional flexibilizer can be any of the well known materials used for this purpose such as the Union Carbide ERL-4350, Dow Chemical Co. Voranol 2070, Rucoflex S-1028-210 from Ruco Polymer Co., and the B.F. Goodrich butadiene-acrylonitrile copolymers sold under the tradename HYCAR.

A preferred flexibilizer is one which does not significantly depress the glass transition temperature of the formulation such as maleic anhydride adducts of polybutadiene resins sold by Ricon Resins as R-130. Other flexibilizers which may be incorporated into the formulation to lower the modulus or the glass transition temperature include polyether polyols such as Voranol® from Dow Chemical or Tone products from Union Carbide, or any other hydroxyl containing polymers which will provide the desired glass transition temperature ranging from about 30° C. to 120° C. and preferably from about 30° C. to 50° C.

Generally, when present in the uncured chemical composition, the flexibilizer is present at a composition ranging from about 0 to 15 wt %, preferably from about 5 to 12 wt %, and more preferably from about 8 to 10 wt % of the uncured system.

E. INORGANIC FILLERS

The composition of the invention may also comprise an inorganic filler. Encapsulants may be filled with an inorganic powder to reduce the coefficient of thermal expansion. The optional inorganic filler can be any of the powdered solids known in the art, such as alumina, silica, zinc oxide, talc, etc. For microelectronic applications, the preferred filler is a highly purified form of silica with particle size of 25 microns or less. Generally, the amount of filler may vary but is preferred in the range of 0 to 75 wt %, and preferably in the range of 50–70 wt % on a weight basis, and more preferably about 60 to 65 wt % of the uncured system. A summary of constituent concentrations in the uncured composition may be found in Table 1, below.

TABLE 1

| CONSTITUENT | USEFUL (wt %) | PREFERRED | MORE PREFERRED |
|---|---|---|---|
| Acetal Diepoxide | 5–99 | 10–50 | 15–25 |
| Second Epoxy Functional Resin | 0–50 | 5–35 | 15–25 |
| Photoinitiator | 0.1–5 | 0.5–3 | 1.0–2 |
| Filler | 0–75 | 50–70 | 60–65 |
| Tg (° C. without flexibilizer) | 90–120° C. | 100–120° C. | 115–120° C. |
| Flexibilizer | 0–15 | 5–12 | 8–10 |
| Tg (° C. with Flexibilizer) | 15–90° C. | 20–70° C. | 25–50° C. |

APPLICATION AND CURING

The ketal and acetal diepoxides of the invention are synthesized and then mixed with an onium photoinitiator, an inorganic filler, and, optionally, a hydroxy functional flexibilizer. Upon irradiation, the triarylsulfonium salt undergoes homolytic bond cleavage from the excited state to yield a sulfinium cation radical and an aryl radical (IV and V).

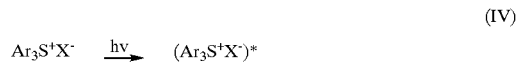

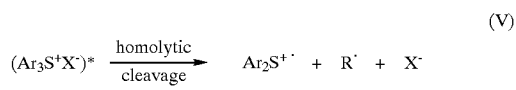

Hydrogen abstraction from a suitable donor (either residual solvent or monomer, Y-H) results in a protonated diaryl sulfide (VI).

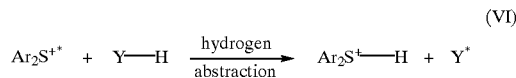

Rapid deprotonation yields a diaryl sulfide and a Bronsted acid (VII).

The photogenerated acid subsequently reacts with an epoxide to protonate the oxirane ring (VIII).

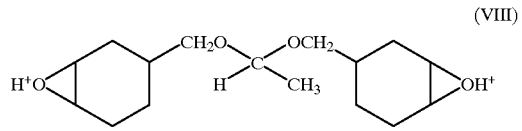

Ring opening results in a carbocation (IX) which further reacts with expoxy monomer to propogate the growing polymer chain (X and XI).

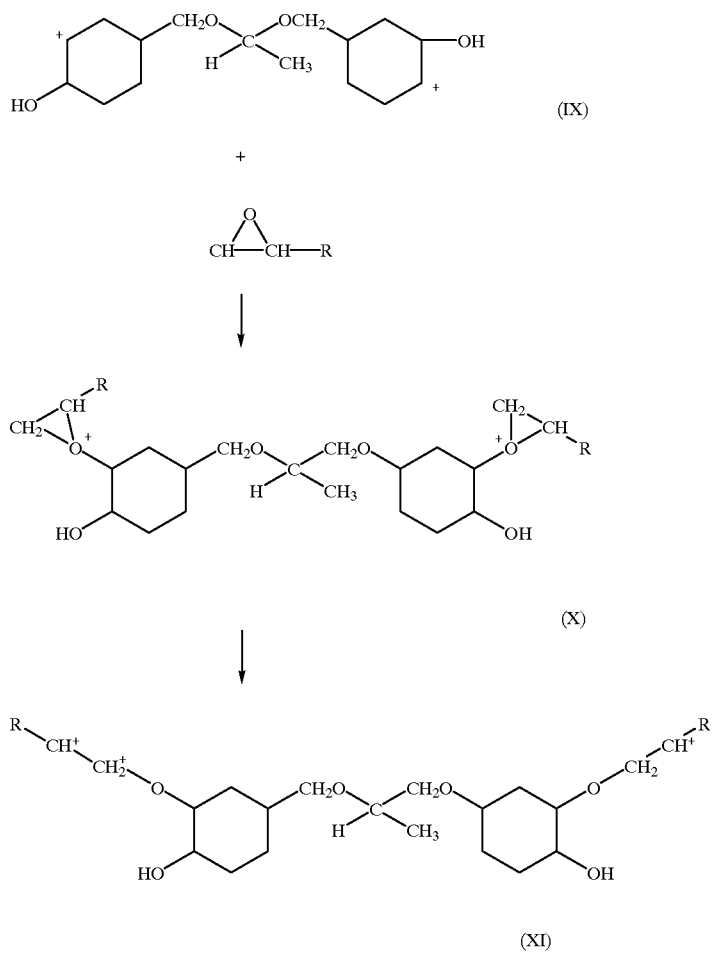

The epoxy formulations may be cured by the application of actinic radiation with or without heat. Generally, the radiation has a wavelength greater than about 200 ηm, and preferably from about 250 ηm to 400 ηm and is used over a cure time of ranging from about 10 to 30 seconds with an exposure of about 3 to 12 J/cm². If a postexpose bake is used the composition is heated at 90–200° C. for one to six hours, preferably 100–150° C. for about two hours to form a hard tack-free solid. The preferred curing schedule includes exposure to actinic radiation (365 ηm) for a dose of 6–8 J/Cm².

RECOVERY

After curing, the cleavable diepoxide formulations can be dissolved by hydrolysis or trans-etherification of the cleavable link, which is an acetal group connecting two cycloaliphatic epoxy groups. Acetals and ketals are generally easily cleaved in aqueous acid, but in order to dissolve the matrix an organic solvent is also needed. Many mixtures of organic solvents, acid or acids, and water can be used. For the purposes of this invention, suitable acids include organic acids such as acetic acid, propanoic acid, chloroacetic acid, benzoic acid, trichloroacetic acid, trifluoroacetic acid, and the like; sulfonic acids such as benzene sulfonic acid, p-toluene sulfonic acid, methane sulfonic acid, and the like; inorganic acids such as sulfuric acid, phosphoric acid, hydrochloric acid, and the like. These structures are exemplary only and are disclosed to illustrate the types of solvents and acids to be used. The preferred acids are methane sulfonic acid, and p-toluene sulfonic acid.

The temperature of the solvent mixture can be 25° C. or above, preferably ranging from about 25° C. to 125° C., but for most rapid dissolution, the solvents should be heated to boiling or near boiling. When used, mixtures of ethanol, acetic acid, and water are particularly effective in dissolving the cured formulations based on acetal diepoxide. Other suitable solvent mixtures include a combination of gamma butyrolactone, water, and phosphoric acid and a combination of butanol, acetic acid, and water. Acetals and ketals are also susceptible to trans-etherification under acidic conditions. Thus, it becomes possible to use an alcohol as both the solvent and the reactant, removing the necessity of adding water to the system thereby reducing the likelihood of corrosion of metallic components of the device.

For example, a mixture of ethanol and an organic acid such as benzene sulfonic acid, para-toluene sulfonic acid, or methane sulfonic acid can be used to dissolve the cured epoxy base of the acetal diepoxide. Trans-etherification using a primary alcohol such as ethanol and an organic acid such as a methane sulfonic acid is faster than hydrolysis in aqueous acid. An even faster dissolution rate was obtained by the incorporation of a portion of a less polar organic solvent such as xylene or benzyl alcohol or by the use of trifluoro ethanol instead of ethanol.

One solvent system used in accordance with the invention comprises primary and secondary alcohols such as ethanol, methanol, butanol, ethylene glycol and mixtures thereof. Di-functional alcohols such as glycols may be used to impart a higher boiling point to the solvent blend. Less polar organic solvents may also be used such as benzyl alcohol, xylene, and toluene. One exemplary solvent system comprises a 1:1:1 wt % ratio of ethylene glycol, butanol, and xylene. Another system which is less corrosive comprises about 60 to 100 wt %, preferably 80 to 100 wt % primary alcohol or diol and about 0 to 40 wt %, preferably 0 to 20 wt % less polar organic solvent, i.e., benzyl alcohol, xylene, toluene, or mixtures thereof. The solvent system may also comprise an acid source such as an organic acid as exemplified by methane sulfonic acid, p-toluene sulfonic acid, or trifluoro methane sulfonic acid present in a concentration ranging from 0.2–0.6M, and preferably 0.25 to 0.35M. Additionally, about 30 parts of ethylene glycol is used in the solvent. Optionally, the solvent includes a surfactant and/or a corrosion inhibitor.

WORKING EXAMPLES

The following examples are intended to provide a non-limiting illustration of the invention.

Example 1A

A thermosetting encapsulant was formulated with the constituents found below.

| Resin | Weight |
|---|---|
| Acetal diepoxide (acetaldehyde bis-(3,4-epoxy-hexahydrobenzyl) acetal) | 0.500 g |
| ERL 4221 (cyclocliphatic Epoxide from Union Carbide) | 0.500 g |
| UVI6974H (sulfonium salt from Union Carbide) | 0.020 g |
| Nyacol DP4920/10 (silica filler from PQ Corporation) | 1.894 g |

The formulation of Example 1 was cured under a Fusion Systems UV Curing Unit to 4 J/cm$^2$ to a hard, tack-free finish. The glass transition temperature (Tg) of the composition, as measured by dynamic mechanical analysis, was 115° C.

Example 1B

An additional thermoset was formulated as seen below.

| Resin | Weight |
|---|---|
| Acetal diepoxide (acetaldehyde bis-(3,4-epoxy-hexahydrobenzyl) acetal) | 0.500 g |
| ERL 4221 (cyclocliphatic Epoxide from Union Carbide) | 0.500 g |
| UVI6974H (sulfonium salt from Union Carbide) | 0.050 g |
| Nyacol DP4920/10 (silica filler from PQ Corporation) | 1.894 g |

The formulation of Example 1B was also cured to a tack-free finish following exposure to 4 J/cm$^2$. The Tg of the formulation was 97° C.

The reworkable encapsulant formulations of Examples 1A and 1B were dissolved in a solution comprised of 0.3M methane sulfonic acid in a 1:1:1 blend of ethylene glycol, n-butyl alcohol and xylene, heated to 105° C. The dissolution rate was on the order of 20–30 mg/min.

Example 2

Additionally, Examples 2A through 2D were formulated to test the reworkability of the composition of the invention.

| Resin | Weight |
|---|---|
| Wt. Acetal diepoxide (acetaldehyde bis-(3,4-epoxy-hexahydrobenzyl) acetal) | 0.9982 g |
| Wt. ERL 4221 (cyclocliphatic Epoxide from Union Carbide) | 0.0000 g |
| Wt. UVI 6974H* (sulfonium salt from Union Carbide) | 0.0570 g |
| Wt. Nyacol DP4910/20 (silica filler from PQ Corporation) | 1.9924 g |
| Tg (cured) | 92° C. |

*50 wt % solution in propylene carbonate

Example 2B

| Resin | Weight |
|---|---|
| Wt. Acetal diepoxide (acetaldehyde bis-(3,4-epoxy-hexahydrobenzyl) acetal) | 0.0000 g |
| Wt. ERL 4221 (cyclocliphatic Epoxide from Union Carbide) | 0.9950 g |
| Wt. UVI 6974H* (sulfonium salt from Union Carbide) | 0.0516 g |
| Wt. Nyacol DP4910/20 (silica filler from PQ Corporation) | 1.9431 g |
| Tg (cured) | 162° C. |

*50 wt % solution in propylene carbonate

Example 2C

| Resin | Weight |
|---|---|
| Wt. Acetal diepoxide (acetaldehyde bis-(3,4-epoxy-hexahydrobenzyl) acetal) | 0.5565 g |
| Wt. ERL 4221 (cyclocliphatic Epoxide from Union Carbide) | 0.5562 g |
| Wt. UVI 6974H* (sulfonium salt from Union Carbide) | 0.0568 g |

-continued

| Resin | Weight |
| --- | --- |
| Wt. Nyacol DP4910/20 (silica filler from PQ Corporation) | 2.1733 g |
| Tg (cured) | 110° C. |

*50 wt % solution in propylene carbonate

Example 2D

| Resin | Weight |
| --- | --- |
| Wt. Acetal diepoxide (acetaldehyde bis-(3,4-epoxy-hexahydrobenzyl) acetal) | 0.5034 g |
| Wt. ERL 4221 (cyclicaliphatic Epoxide from Union Carbide) | 0.5053 g |
| Wt. UVI 6974H* (sulfonium salt from Union Carbide) | 0.1006 g |
| Wt. Nyacol DP4910/20 (silica filler from PQ Corporation) | 2.0658 g |
| Tg (cured) | 106° C. |

*50 wt % solution in propylene carbonate

All samples were cured under a Fusion System D bulb using a static exposure of 20 s (6.5 J/cm²). The glass transition temperature was determined from dynamic mechanical analysis as the peak in the loss modulus vs. temperature curve. Correcting for wt. percentage of solvent, Examples 2A–2C contain approximately 2.5 wt % of the photoinitiator (UVI 6974H); Example 2D contains approximately 5.0 wt % initiator. All of the samples contain 65 wt % of the silica filler (Nyacol DP4910/20).

Cured samples of each of the Examples were immersed in a 0.3M methane sulfonic acid solution in 1:1:1 n-butanol:xylenes:ethylene glycol thermostatted at 105° C. Examples 2A, 2C and 2D (150 mg) totally dissolved within 15 min; Example 2B exhibited no weight loss even following immersion for 60 min. By blending the ERL 4221 with the acetal diepoxide, the cost of the formulation can be driven down and the temperature/humidity stability increased. A slight increase in Tg compared with the 100% acetal diepoxide formulation can also be realized. However, if the ERL 4221 concentration exceeds 50 wt %, the reworkability of the formulation is deleteriously affected (dissolution time rises drastically).

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. An uncured thermosetting composition which is capable of curing upon exposure to actinic radiation, said composition comprising:

(a) an acetal diepoxide of the formula:

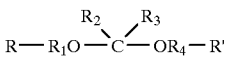

wherein R and R' are individually an aliphatic epoxy moiety, or a cycloaliphatic epoxy moiety;

$R_1$ and $R_4$ are individually an alkylene, substituted allylene, arylene, or aryl alkylene, substituted alkyl arylene, alkyl arylene, and cyclic alkylene; and $R_2$ and $R_3$ are individually hydrogen, alkyl, oxyalkyl, substituted alkyl aryl, alkyl aryl, and cylcic alkyl; and (b) a photoacid generating photoinitiator.

2. The composition of claim 1, wherein R and R' are individually a cycloaliphatic epoxy moiety selected from the group consisting of a cyclic alkyl, a bridged alkyl, a heterocyclic alkyl, a polycyclic alkyl, and mixtures thereof.

3. The composition of claim 2, wherein R and R' comprise a cycloaliphatic epoxy moiety, R and R' are individually selected from the group consisting of a cyclohexane epoxy moiety, a substituted cyclohexane epoxy moiety, and mixtures thereof.

4. The composition of claim 1, wherein R and R' are individually cyclohexyl, $R_1$ and $R_4$ are $CH_2$; $R_3$ and $R_2$ is H.

5. The composition of claim 1, wherein said composition additionally comprises a second epoxy functional resin.

6. The composition of claim 5, wherein said second epoxy functional resin is selected from the group consisting of a diglycidyl ether of bisphenol A, a bisphenol F, a cycloaliphatic epoxy resin, and mixtures thereof.

7. The composition of claim 1, wherein said acetal diepoxide is present in a concentration ranging from about 5 wt % to 99.0 wt %.

8. The composition of claim 7, wherein said composition additionally comprises a second epoxy functional resin, the weight ratio of said acetal diepoxide to said second epoxy functional resin ranging from about 1:1 to 3:1.

9. The composition of claim 1, wherein said photoinitiator comprises an onium salt.

10. The composition of claim 9, wherein said onium salt is selected from the group consisting of a diazonium salt, a halonium salt, a sulfonium salt, and mixtures thereof.

11. The composition of claim 9, wherein said photoinitiator comprises a sulfonium salt.

12. The composition of claim 9 wherein said photoinitiator is present in a concentration ranging from about 0.1 wt % to 5 wt %.

13. The composition of claim 1, additionally comprising an inorganic filler.

14. The composition of claim 13, wherein said inorganic filler is present in a concentration ranging from about 50 wt % to 70 wt %.

15. The composition of claim 14, wherein said filler is selected from the group consisting of silica, zinc oxide, talc, alumina, and mixtures thereof.

16. The composition of claim 15, wherein said inorganic filler comprises silica having a particle size of about 25 microns or less.

17. The composition of claim 1, additionally comprising a flexibilizer wherein said composition has a Tg of from about 15° C. to 90° C.

18. The composition of claim 17, wherein said flexibilizer is selected from the group consisting of a rubber compound, a hydroxy functional compound, and mixtures thereof.

19. The composition of claim 17, wherein said flexibilizer comprises polyetherpolyol, present in a concentration ranging from about 5 wt % to 12 wt %.

20. A cured encapsulant resin comprising the reaction product of:

(a) an acetyl diepoxide of the formula:

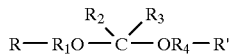

wherein R and R' are individually an aliphatic epoxy moiety, or a cycloaliphatic epoxy moiety;

$R_1$ and $R_4$ are alkylene, substituted alkylene, aryl alkylene or arylene; and $R_2$ and $R_3$ are individually hydrogen, alkyl, oxyakyl, substituted alkyl aryl, alkyl aryl, and cyclic alkyl;

(b) a photoacid generating photoinitiator; and (c) an inorganic filler wherein said cured encapsulant resin is soluble in a dilute acid solution thereby allowing recovery after application.

21. The composition of claim 20, wherein R and R' are individually a cycloaliphatic epoxy moiety selected from the group consisting of a cyclic alkyl, a bridged alkyl, a heterocyclic alkyl, a polycyclic alkyl, and mixtures thereof.

22. The composition of claim 20, wherein R and R' comprise a cycloaliphatic epoxy moiety, R and R' are individually selected from the group consisting of a cyclohexane moiety, a substituted cyclohexane epoxy moiety, and mixtures thereof.

23. The composition of claim 20, wherein R and R' are individually cyclohexyl, $R_1$ and $R_4$ are $CH_2$; $R_3$ is $CH_3$ and $R_2$ is H.

24. The composition of claim 20, wherein said composition additionally comprises the reaction product of an acetal diepoxide and a second epoxy functional resin.

25. The composition of claim 24, wherein said second epoxy functional resin is selected from the group consisting of a diglycidyl ether of bisphenol A, a bisphenol F, a cycloaliphatic epoxy resin, and mixtures thereof.

26. The composition of claim 20, wherein before curing said acetal diepoxide is present in a concentration ranging from about 5 wt % to 99.0 wt %.

27. The composition of claim 26, wherein before curing said composition additionally comprises a second epoxy functional resin, the weight ratio of said acetal diepoxide to said second epoxy functional resin ranging from about 1:1 to 3:1.

28. The composition of claim 20, wherein said inorganic filler is present in a concentration ranging from about 50 wt % to 70 wt %.

29. The composition of claim 28, wherein said filler is selected from the group consisting of silica, zinc oxide, talc, alumina, and mixtures thereof.

30. The composition of claim 20, wherein said inorganic filler comprises silica having a particle size of about 25 microns or less.

31. The composition of claim 20, additionally comprising a flexibilizer wherein said composition has a Tg of from about 15° C. to 90° C.

32. The composition of claim 31, wherein said flexibilizer is selected from the group consisting of a rubber compound, a hydroxy functional compound, and mixtures thereof.

33. The composition of claim 32, wherein said flexibilizer comprises polyetherpolyol, present in a concentration ranging from about 5 wt % to 12 wt %.

34. A method of recovering a cured thermosetting encapsulant resin comprising the reaction product of:

(a) an acetal diepoxide of the formula:

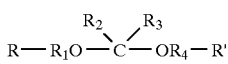

wherein R and R' are individually an aliphatic epoxy moiety, or a cycloaliphatic epoxy moiety;

$R_1$ and $R_4$ are individually an alkylene, substituted alkylene, arylene, or aryl alkylene, and $R_2$ and $R_3$ are individually hydrogen, an alkyl, an alkoxy, a substituted alkyl aryl, an alkyl aryl, and a cyclic alkyl;

(b) a photoinitiator; and (c) an inorganic filler, wherein said cured encapsulant resin is soluble in a dilute acid solution thereby allowing recovery, said method comprising the steps of subjecting the encapsulant resin to an acidic solvent for a period of time adequate to substantially dissolve said resin.

35. The method of claim 34, wherein said acidic solvent comprises an acid source selected from the group consisting of acetic acid, methane sulfonic acid, trichloroacetic acid, trifluoroacetic acid, para-toluene sulfonic acid, and mixtures thereof.

36. The method of claim 34, wherein said acidic solvent has a temperature ranging from about 25° C. to 125° C.

37. The method of claim 34, wherein said cured encapsulant comprises the reaction product of an acetal diepoxide and a second epoxy functional resin selected from the group consisting of a diglycidyl ether of bisphenol A, a cycloaliphatic epoxy resin, and mixtures thereof.

38. The method of claim 34, wherein said acid solvent comprises about 0.3M of methane sulfonic acid, with butanol, ethylene glycol, and xylene, said butanol, ethylene glycol, and xylene present in a 1:1:1 wt % ratio.

* * * * *

UNITED STATES PATENT AND TRADEMARK OFFICE
CERTIFICATE OF CORRECTION

PATENT NO. : 6,008,266
DATED : Dec. 28, 1999
INVENTOR(S) : Joseph Paul Kuczynski and Laura Marie Mulholland It is certified that error appears in the above-identified patent and that said Letters Patent is hereby corrected as shown below:

Claim 1, Col. 14, Line 10, "allylene" should be --alkylene--.

Claim 20, Col. 15, Line 13, "oxyakyl" should be --oxyalkyl--.

Signed and Sealed this

First Day of August, 2000

*Attest:*

Q. TODD DICKINSON

*Attesting Officer*         *Director of Patents and Trademarks*